United States Patent
Nakagawa et al.

(10) Patent No.: US 7,582,406 B2
(45) Date of Patent: Sep. 1, 2009

(54) RESIST COMPOSITION AND METHOD FOR FORMING RESIST PATTERN

(75) Inventors: Yusuke Nakagawa, Kawasaki (JP); Shinichi Hidesaka, Kawasaki (JP); Kazuhiko Nakayama, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 253 days.

(21) Appl. No.: 11/575,062

(22) PCT Filed: Aug. 19, 2005

(86) PCT No.: PCT/JP2005/015165
§ 371 (c)(1), (2), (4) Date: Mar. 9, 2007

(87) PCT Pub. No.: WO2006/030604
PCT Pub. Date: Mar. 23, 2006

(65) Prior Publication Data
US 2009/0004598 A1 Jan. 1, 2009

(30) Foreign Application Priority Data
Sep. 13, 2004 (JP) .............................. 2004-266055
Aug. 4, 2005 (JP) .............................. 2005-226487

(51) Int. Cl.
*G03F 7/004* (2006.01)
*G03F 7/30* (2006.01)

(52) U.S. Cl. .................... 430/270.1; 430/326; 430/330

(58) Field of Classification Search .............. 430/270.1, 430/326, 330
See application file for complete search history.

(56) References Cited

U.S. PATENT DOCUMENTS

| | | | |
|---|---|---|---|
| 5,928,837 A | 7/1999 | Sato et al. | |
| 5,976,760 A | 11/1999 | Oomori et al. | |
| 6,004,720 A | 12/1999 | Takechi et al. | |
| 6,569,596 B1 | 5/2003 | Uetani et al. | |
| 7,232,643 B2 * | 6/2007 | Nitta | 430/270.1 |
| 7,416,832 B2 * | 8/2008 | Kawana et al. | 430/270.1 |
| 7,449,276 B2 * | 11/2008 | Hojo et al. | 430/270.1 |
| 2002/0045130 A1 | 4/2002 | Nitta et al. | |
| 2005/0095527 A1 | 5/2005 | Yokoyama et al. | |

FOREIGN PATENT DOCUMENTS

| | | |
|---|---|---|
| JP | 11-095434 | 4/1999 |
| JP | 2002-184763 | 6/2002 |
| JP | 2004-026804 | 1/2004 |

OTHER PUBLICATIONS

International Search Report from PCT/JP2005/015165 dated Nov. 15, 2005.

* cited by examiner

*Primary Examiner*—John S Chu
(74) *Attorney, Agent, or Firm*—Knobbe, Martens, Olson & Bear, LLP

(57) ABSTRACT

A resist composition is obtained by dissolving a resin component (A) that exhibits changed alkali solubility under the action of acid, an oxime sulfonate-based acid generator (B), an amine compound (D) containing at least one alkyl group of 5 to 12 carbon atoms, and an organic acid (E), in an organic solvent (C) containing methyl n-amyl ketone, wherein the component (E) is a dibasic acid.

14 Claims, No Drawings

RESIST COMPOSITION AND METHOD FOR FORMING RESIST PATTERN

RELATED APPLICATIONS

This application is the U.S. National Phase filing under 35 U.S.C. §371 of PCT/JP2005/015165, filed Aug. 19, 2005, which designated the United States and was published in a language other than English, which claims priority under 35 U.S.C. §119(a)-(d) to Japanese Patent Application No. 2004-266055, filed Sep. 13, 2004, and Japanese Patent Application No. 2005-226487, filed Aug. 4, 2005. The content of these applications is incorporated herein by reference in their entireties.

TECHNICAL FIELD

The present invention relates to a resist composition and a method for forming a resist pattern.

BACKGROUND ART

In recent years, in the production of semiconductor elements and liquid crystal display elements, advances in lithography techniques have lead to rapid progress in the field of pattern miniaturization. Typically, these miniaturization techniques involve shortening the wavelength of the exposure light source. Conventionally, ultraviolet radiation such as g-line and i-line radiation has been used, but nowadays, KrF excimer lasers (248 nm) have been introduced.

Furthermore, one example of a resist material that satisfies the high resolution conditions required to enable reproduction of a pattern of minute dimensions is a chemically amplified resist composition, which includes a base resin that exhibits changed alkali solubility under the action of acid, and an acid generator that generates acid upon exposure. Chemically amplified resist compositions include negative compositions, which contain a cross-linking agent and an alkali-soluble resin that acts as a base resin, and positive compositions, which contain a resin that exhibits increased alkali solubility under the action of acid.

Recently, the miniaturization of semiconductor elements has progressed even further, and the development of processes that use ArF excimer lasers (193 nm) is being vigorously pursued, and as a result, a variety of chemically amplified resist compositions have been developed for use with KrF excimer lasers and for use with ArF excimer lasers.

Examples of acid generators that have been used in these types of chemically amplified resist compositions are numerous, and include onium salt-based acid generators such as iodonium salts and sulfonium salts, oxime sulfonate-based acid generators, diazomethane-based acid generators such as bisalkyl or bisaryl sulfonyl diazomethanes, poly(bis-sulfonyl)diazomethanes and nitrobenzyl sulfonates, iminosulfonate-based acid generators, and disulfone-based acid generators.

In resist compositions for use with ArF excimer lasers, the so-called onium salt-based acid generators, which exhibit a powerful acid-generating capability, are the most widely used (for example, see patent reference 1).

[Patent Reference 1]
Japanese Unexamined Patent Application, First Publication No. Hei 7-234511

DISCLOSURE OF INVENTION

However, if an onium salt-based acid generator is used, then in some cases the cross-sectional shape of the resist pattern may develop so-called footing (a state where the lower edges of the pattern form a tapered shape), meaning a pattern with favorable rectangular formability is unobtainable. In contrast, if a so-called oxime sulfonate-based acid generator is used, an improvement in the pattern shape can be achieved.

However, although use of an oxime sulfonate-based acid generator provides an improvement in the shape, problems remain in terms of the stability over time of the resist pattern and the occurrence of developing defects, meaning further improvements have been sought.

The present invention takes the above circumstances into consideration, with an object of providing a resist composition that includes an oxime sulfonate-based acid generator, wherein the stability over time of the resist pattern is improved, and the level of developing defects is reduced.

In order to achieve the above object, the present invention adopts the aspects described below.

A resist composition of the present invention includes a resin component (A) that exhibits changed alkali solubility under the action of acid, an oxime sulfonate-based acid generator (B), an amine compound (E)) containing at least one alkyl group of 5 to 12 carbon atoms, and an organic acid (E), all dissolved in an organic solvent (C) containing methyl n-amyl ketone, wherein the component (E) is a dibasic acid.

A method for forming a resist pattern of the present invention includes applying a resist composition of the present invention to a substrate, conducting a prebake, performing selective exposure, and then conducting PEB (post exposure baking), and performing alkali developing to form the resist pattern.

Furthermore, another method for forming a resist pattern of the present invention includes a resist pattern formation process, which includes the steps of applying a resist composition of the present invention to a substrate, conducting a prebake, performing selective exposure, subsequently conducting post exposure baking (PEB), and performing alkali developing to form the resist pattern; and a narrowing process that narrows the pattern size of the obtained resist pattern by conducting a heat treatment.

In the present invention, the term "structural unit" refers to a monomer unit that contributes to the formation of a polymer.

Furthermore, the term "exposure" is used as a general concept that includes irradiation with any form of radiation.

An object of the present invention is to provide a resist composition that includes an oxime sulfonate-based acid generator, wherein the stability over time of the resist pattern is improved, and the level of developing defects is reduced.

Here, developing defects refer to scum and general resist pattern abnormalities detected by inspection of the developed resist pattern from directly above the resist pattern using a surface defect inspection device (brand name: KLA) manufactured by KLA Tencor Corporation. These types of defects can cause a reduction in process yields and a deterioration in product performance, and consequently represent an extremely significant problem.

Furthermore, the term "stability over time of the resist pattern" refers to a property evaluated in the following manner. Namely, prepared resist compositions are stored for a predetermined period under different conditions (for example, one resist composition may be stored at a temperature of $-20°$ C. for 2 weeks, and another resist composition stored at a temperature of $40°$ C. for 2 weeks), and the resist compositions are then used to form resist patterns under the same conditions. The stability over time of the resist pattern can be said to improve as the absolute value decreases for the dimensional difference in pattern size, such as the resist pattern line width, observed when resist patterns are formed using the same exposure dose. Furthermore, the stability over time of the resist pattern may also be referred to as the sensitivity stability over time or the dimensional stability over time.

According to the present invention, a resist composition that includes an oxime sulfonate-based acid generator enables the stability over time of the resist pattern to be improved, and enables the level of developing defects to be reduced.

BEST MODE FOR CARRYING OUT THE INVENTION

[Resist Composition]

A resist composition of the present invention includes a resin component (A) that exhibits changed alkali solubility under the action of acid, an oxime sulfonate-based acid generator (B), an amine compound (D) containing at least one alkyl group of 5 to 12 carbon atoms, and an organic acid (E), all dissolved in an organic solvent (C) containing methyl n-amyl ketone, wherein the component (E) is a dibasic acid.

Component (A)

The component (A) is the so-called base resin component, and this base resin component (A) refers to a resin which, when the resist composition is coated onto a substrate or the like, has the ability to form a resist coating film. A resin component such as an (α-lower alkyl)acrylate ester is typically used.

In the present invention, the expression "(α-lower alkyl) acrylate ester" is a generic term that includes either one of, or both, an acrylate ester and α-lower alkyl acrylate esters such as a methacrylate ester.

Furthermore, the lower alkyl group that functions as the α-position substituent within an "(α-lower alkyl)acrylate ester" is an alkyl group of 1 to 5 carbon atoms, and specific examples of suitable groups include straight-chain or branched lower alkyl groups such as a methyl group, ethyl group, propyl group, isopropyl group, n-butyl group, isobutyl group, tert-butyl group, pentyl group, isopentyl group or neopentyl group.

The expression "structural unit derived from an (α-lower alkyl)acrylate ester" refers to a structural unit that is formed by the cleavage of the ethylenic double bond of the (α-lower alkyl)acrylate ester.

In a resist composition of the present invention, the component (A) can use one or more of the alkali-soluble resins or resins that can be converted to an alkali-soluble state that are typically used as the base resin for chemically amplified resists. The former case describes a so-called negative resist composition, and the latter case describes a positive resist composition. A resist composition of the present invention is preferably a positive composition.

In the case of a negative composition, a cross-linking agent is added to the resist composition together with the acid generator component (B). Then, during resist pattern formation, when acid is generated from the acid generator component (B) upon exposure, the action of this acid causes cross-linking to occur between the component (A) and the cross-linking agent, causing the composition to become alkali-insoluble. As the cross-linking agent, typically an amino-based cross-linking agent such as a melamine, urea, or glycoluril containing a methylol group or alkoxymethyl group is used.

In the case of a positive composition, the component (A) is an alkali-insoluble compound containing so-called acid-dissociable, dissolution-inhibiting groups, and when acid is generated from the acid generator component (B) upon exposure, this acid causes the acid-dissociable, dissolution-inhibiting groups to dissociate, causing the component (A) to become alkali-soluble. In the present invention, positive compositions are preferred.

There are no particular restrictions on the component (A), provided it is able to be used as a base resin component for the resist composition in the manner described above.

However in terms of improving properties such as the resolution in order to achieve properties suited to applications that involve exposure with an ArF excimer laser, the component (A) typically contains at least 80 mol %, and preferably 90 mol % or greater (and most preferably 100 mol %) of structural units derived from (α-lower alkyl)acrylate esters.

In the case of a positive composition, the component (A) contains a structural unit (a1) derived from an (α-lower alkyl) acrylate that contains an acid-dissociable, dissolution-inhibiting group (hereafter referred to as (a1) or an (a1) unit).

In order to satisfy the requirements for superior resolution, dry etching resistance and an ultra fine pattern shape, the component (A) preferably includes the (a1) unit, as well as a plurality of other monomer units with different functions, for example, a combination of the structural units described below.

- A structural unit derived from an (α-lower alkyl)acrylate ester that contains a lactone unit (hereafter referred to as (a2) or an (a2) unit).
- A structural unit derived from an (α-lower alkyl)acrylate ester that contains a polar group-containing aliphatic hydrocarbon group (hereafter referred to as (a3) or an (a3) unit).
- A structural unit containing a polycyclic group that is different from the acid-dissociable, dissolution-inhibiting group of the (a1) unit, the lactone unit of the unit (a2), and the polar group-containing aliphatic hydrocarbon group of the unit (a3) (hereafter referred to as (a4) or an (a4) unit).

Structural Unit (a1)

The structural unit (a1) is a structural unit derived from an (α-lower alkyl)acrylate ester that contains an acid-dissociable, dissolution-inhibiting group.

The acid-dissociable, dissolution-inhibiting group in the structural unit (a1) can use any of the groups that have been proposed as acid-dissociable, dissolution-inhibiting groups for the base resins of chemically amplified resists, provided the group has an alkali dissolution-inhibiting effect that renders the entire component (A) alkali-insoluble prior to exposure, and then following dissociation, causes the entire component (A) to change to an alkali-soluble state. Generally, groups that form either a cyclic or chain-like tertiary alkyl ester, or a chain-like or cyclic alkoxyalkyl group with the carboxyl group of the (α-lower alkyl)acrylate are the most widely known. The term "(meth)acrylate ester" is a generic term that includes either one of, or both, the acrylate ester and the methacrylate ester.

Specific examples of the structural unit (a1) include the structural units represented by general formulas (a1-1) to (a1-4) shown below.

(a1-1)

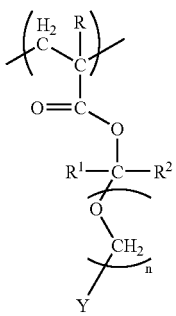
(a1-2)

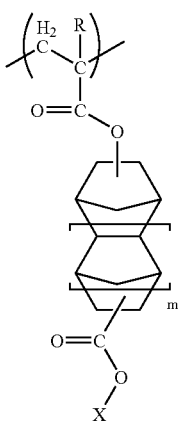
(a1-3)

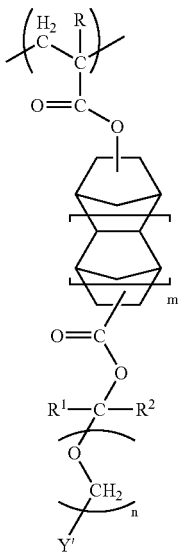
(a1-4)

[In the above formulas, X represents an acid-dissociable, dissolution-inhibiting group that contains an aliphatic branched group or aliphatic cyclic group, Y represents an aliphatic cyclic group, or an alkyl group or alkoxy group of 1 to 10 carbon atoms, Y' represents an aliphatic cyclic group, or an alkyl group or alkoxy group of 1 to 10 carbon atoms, n represents either 0 or an integer from 1 to 3, m represents either 0 or 1, and $R^1$ and $R^2$ each represent, independently, a hydrogen atom or a lower alkyl group of 1 to 5 carbon atoms.]

In this description, the term "aliphatic" is a relative concept used in relation to the term "aromatic", and defines a group or compound or the like that contains no aromaticity.

Furthermore, the term "aliphatic cyclic group" describes a monocyclic group or polycyclic group (alicyclic group) that contains no aromaticity, and although the "aliphatic cyclic group" need not necessarily be a group formed solely from carbon and hydrogen (namely, a hydrocarbon group), a hydrocarbon group is preferred. Furthermore, the "hydrocarbon group" may be either saturated or unsaturated, but is preferably saturated. A polycyclic group (alicyclic group) is particularly desirable.

Specific examples of this type of aliphatic cyclic group include groups in which one or more hydrogen atoms have been removed from a polycycloalkane such as a monocycloalkane, bicycloalkane, tricycloalkane or tetracycloalkane, which may, or may not, be substituted with a fluorine atom or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Specific examples of groups of the above general formulas (a1-1) to (a1-4) are shown below.

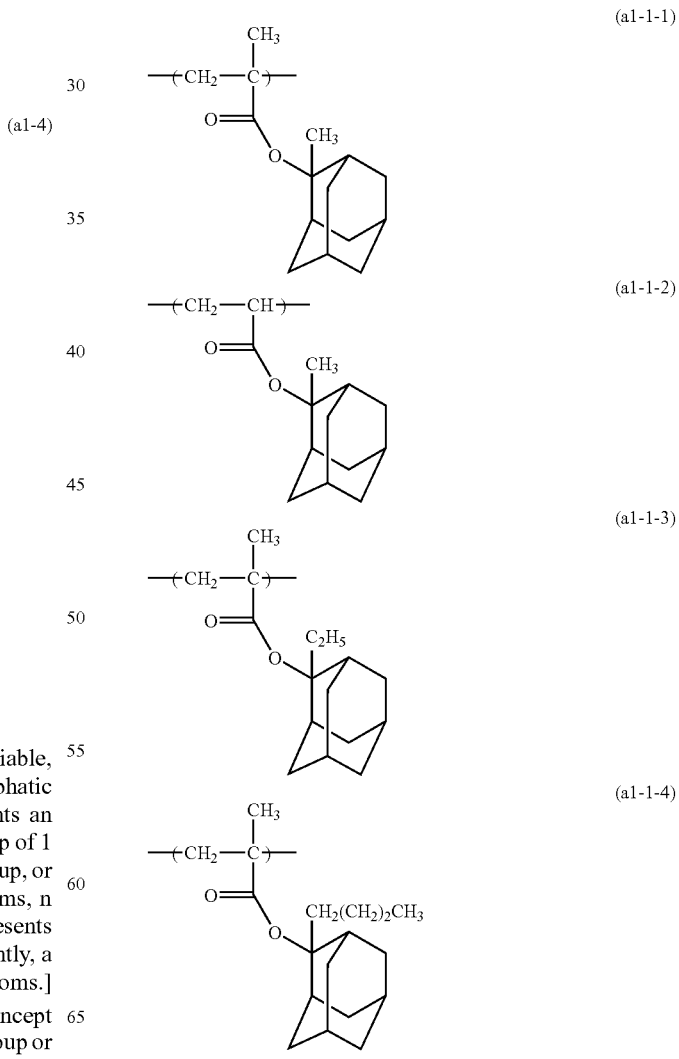

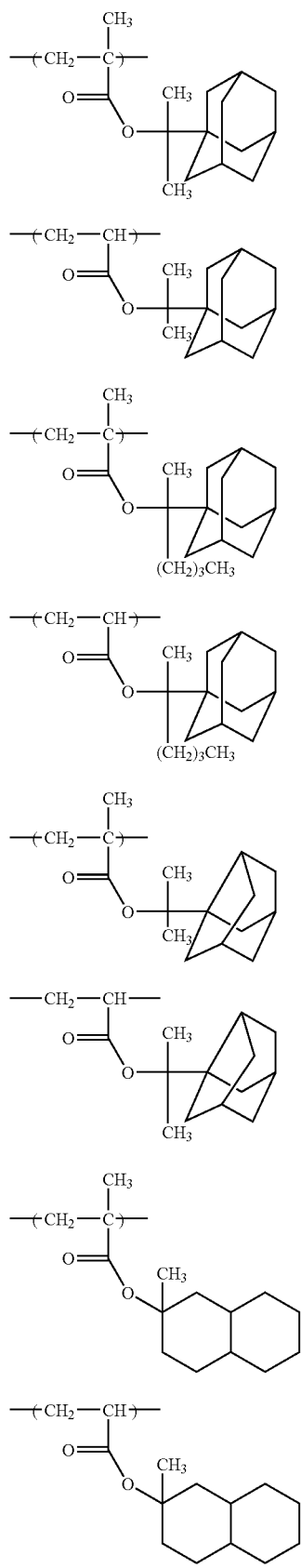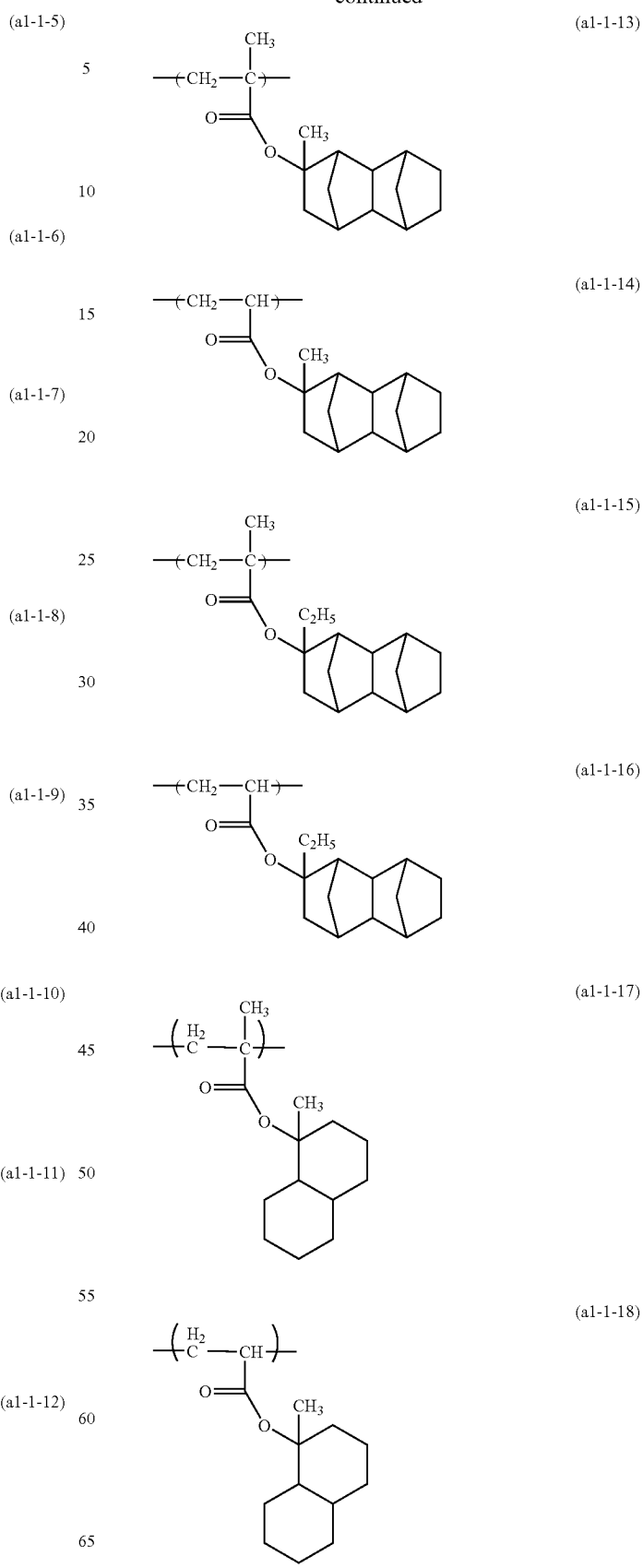

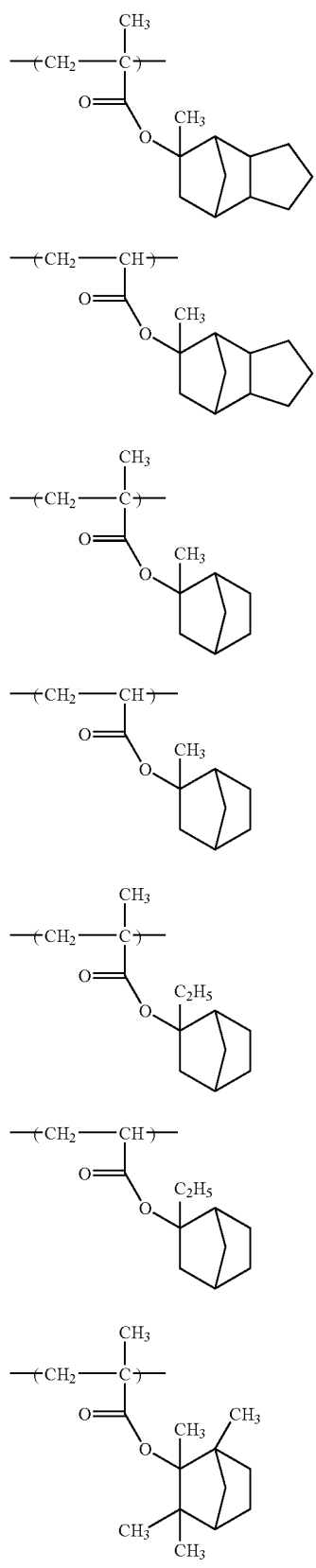

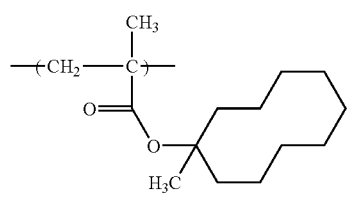
(a1-1-33)
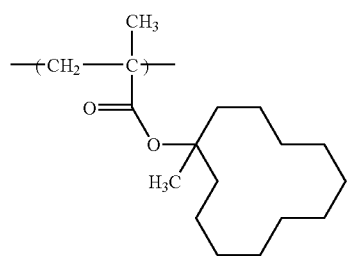
(a1-1-34)
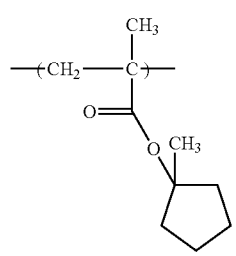
(a1-1-35)
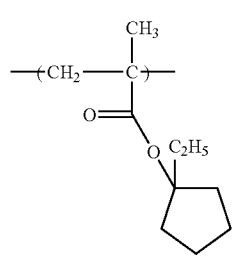
(a1-1-36)
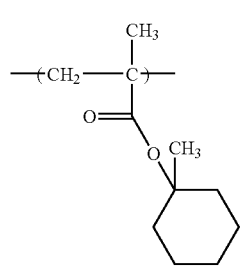
(a1-1-37)
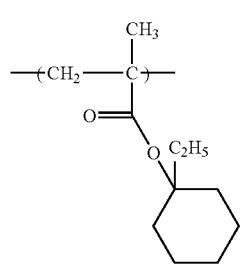
(a1-1-38)
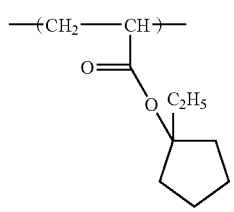
(a1-1-39)
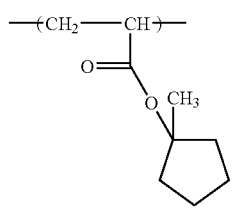
(a1-1-40)
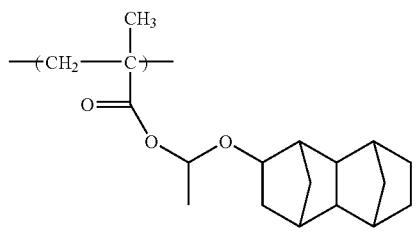
(a1-2-1)
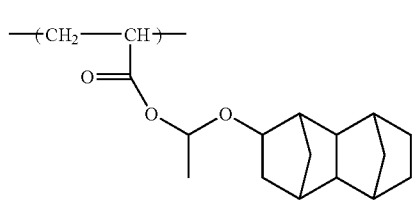
(a1-2-2)
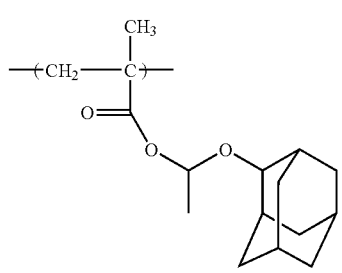
(a1-2-3)
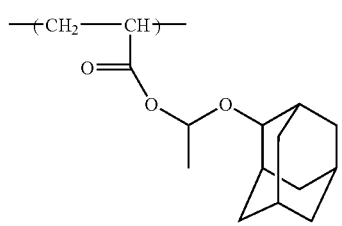
(a1-2-4)
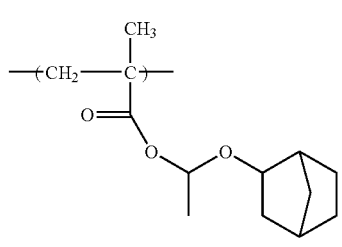
(a1-2-5)

-continued
(a1-2-6) 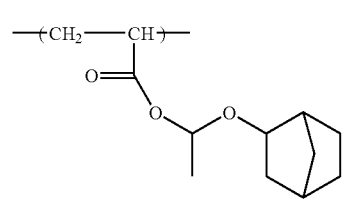
(a1-2-7) 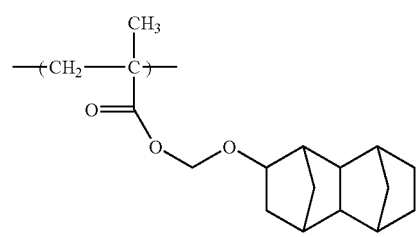
(a1-2-8) 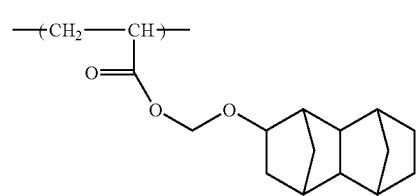
(a1-2-9) 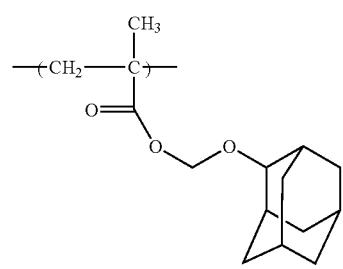
(a1-2-10) 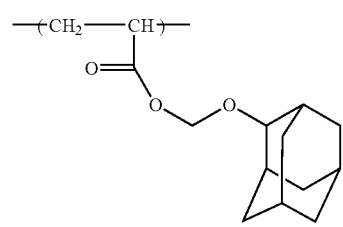
(a1-2-11) 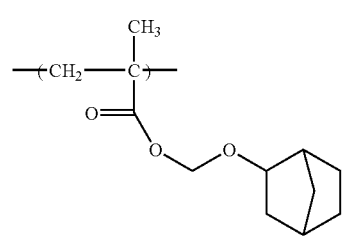
(a1-2-12) 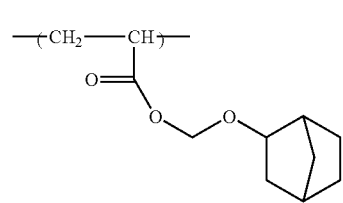
-continued
(a1-2-13) 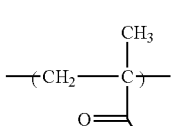
(a1-2-14) 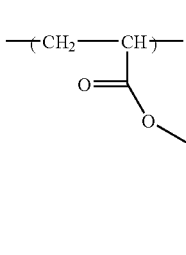
(a1-2-15) 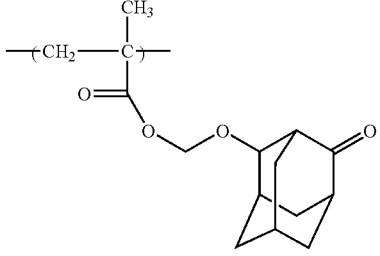
(a1-2-16) 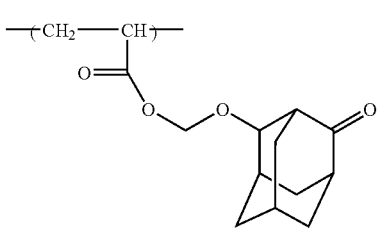
(a1-3-1) 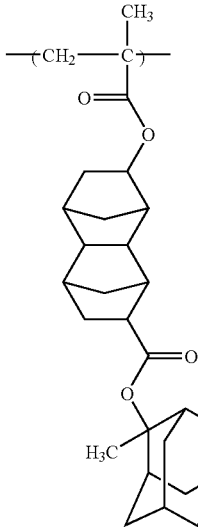

(a1-3-2) 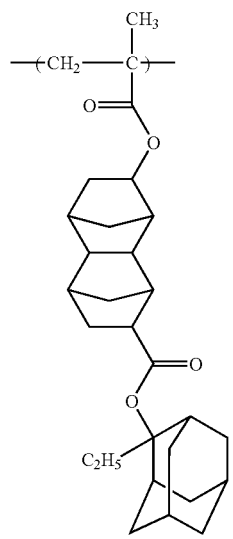
(a1-3-3) 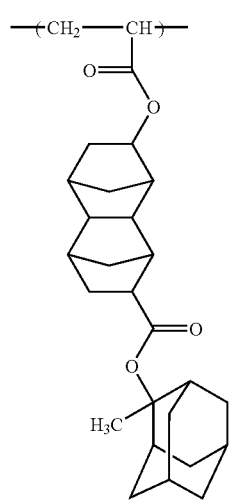
(a1-3-4) 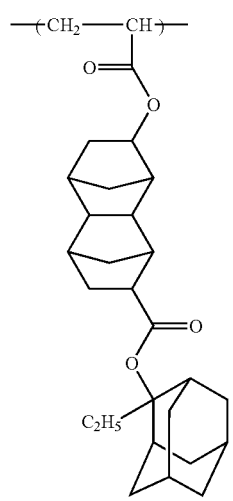
(a1-3-5) 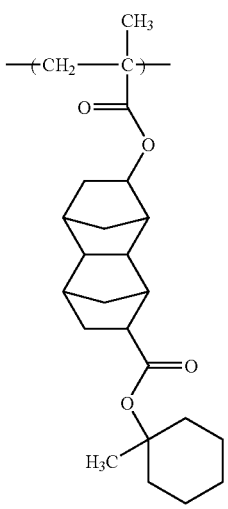
(a1-3-6) 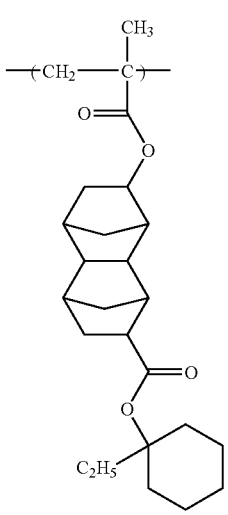
(a1-3-7) 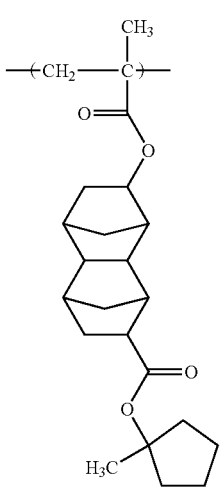

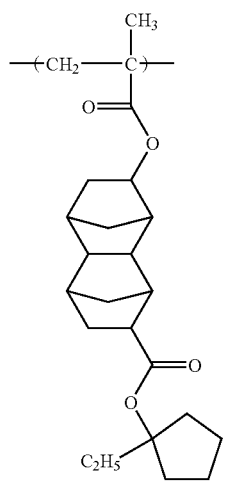
(a1-3-9)
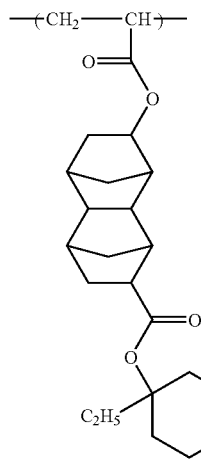
(a1-3-10)
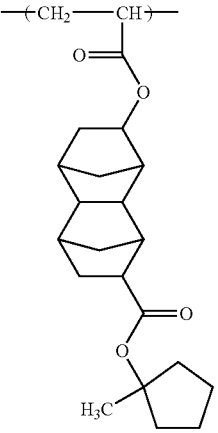
(a1-3-8)
(a1-3-9)
(a1-3-11)
(a1-3-12)
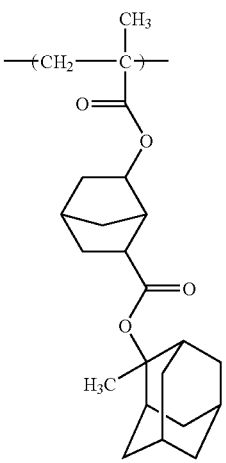
(a1-3-13)

-continued (a1-3-14)

(a1-3-15)

(a1-3-16)

(a1-3-17)

(a1-3-18)

(a1-3-19)

(a1-3-20)

-continued
(a1-3-21)
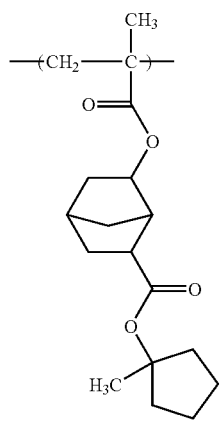
(a1-3-22)
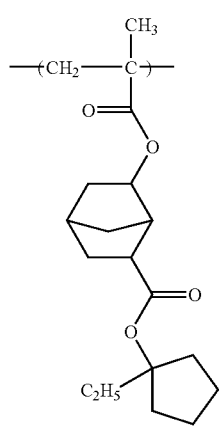
(a1-3-23)
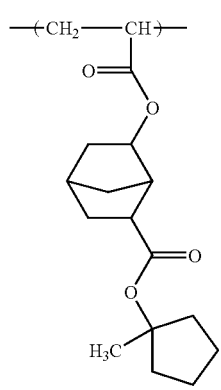
(a1-3-24)
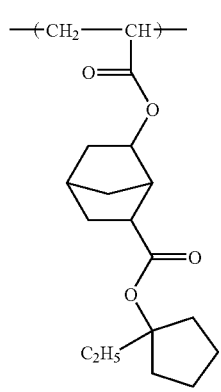
-continued
(a1-4-1)
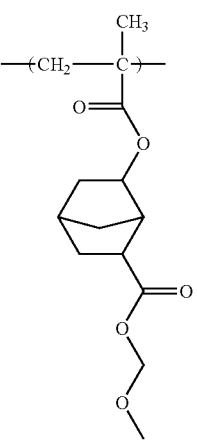
(a1-4-2)
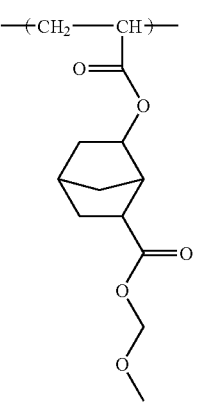
(a1-4-3)
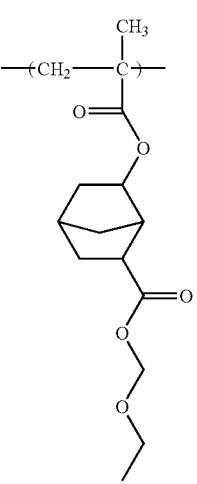

(a1-4-4)
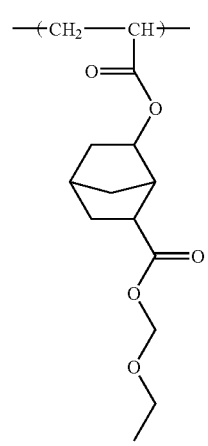
(a1-4-5)
(a1-4-6)
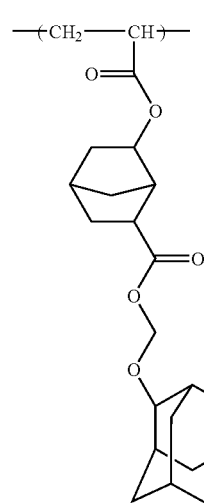
(a1-4-7)
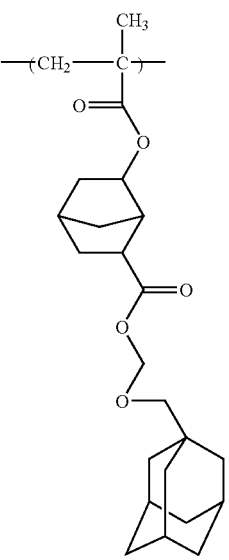
(a1-4-8)
(a1-4-9)
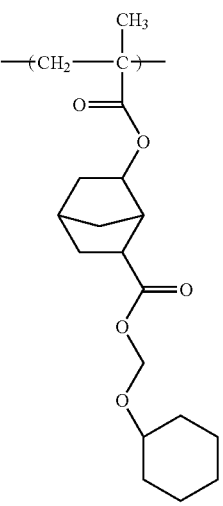

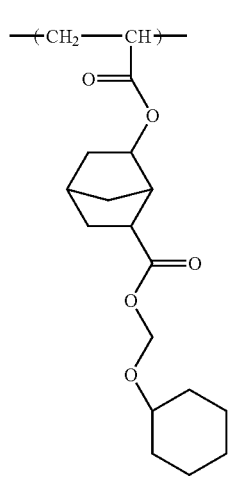 (a1-4-10)
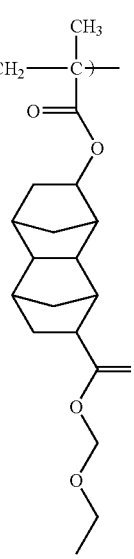 (a1-4-13)
(a1-4-11)
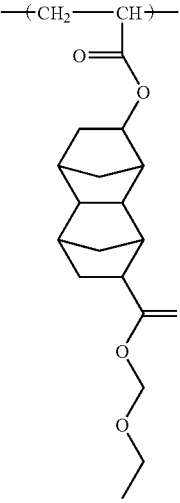 (a1-4-14)
(a1-4-12)
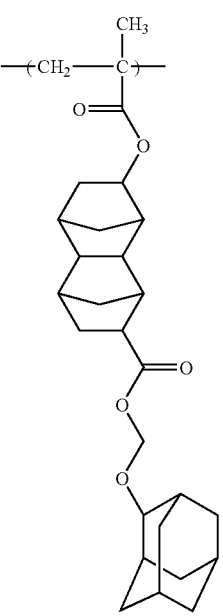 (a1-4-15)

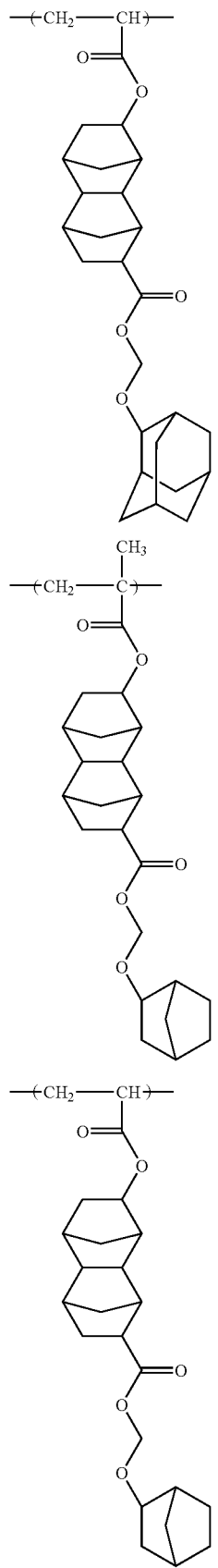
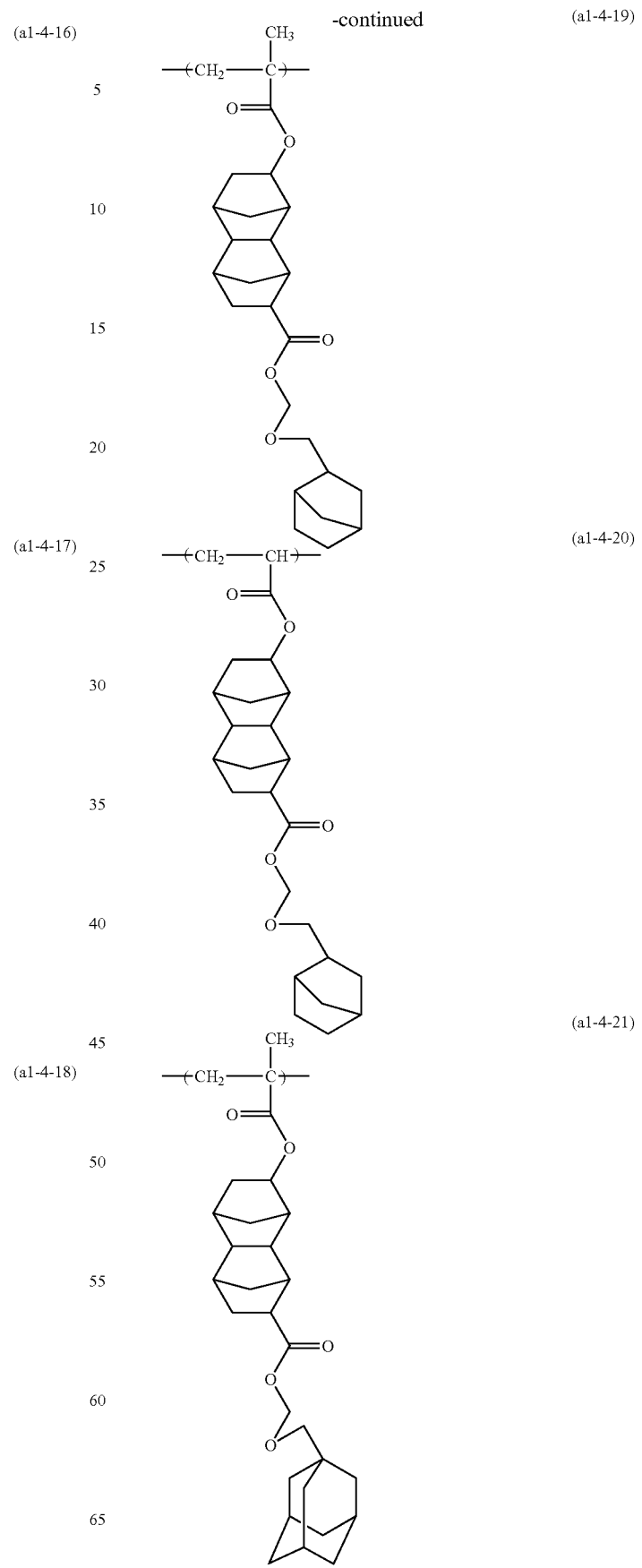

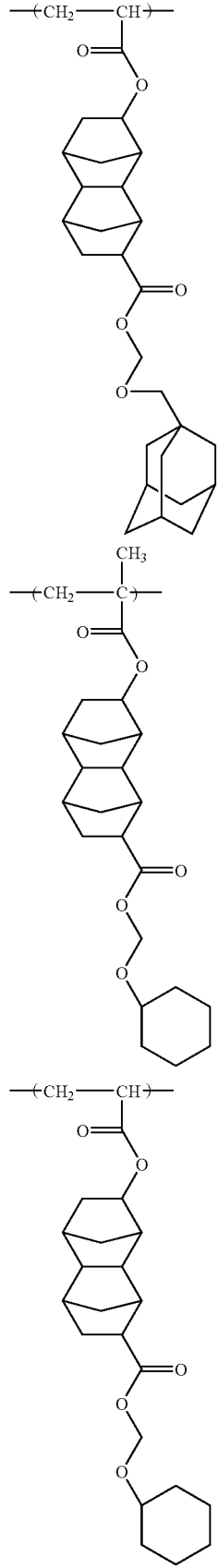
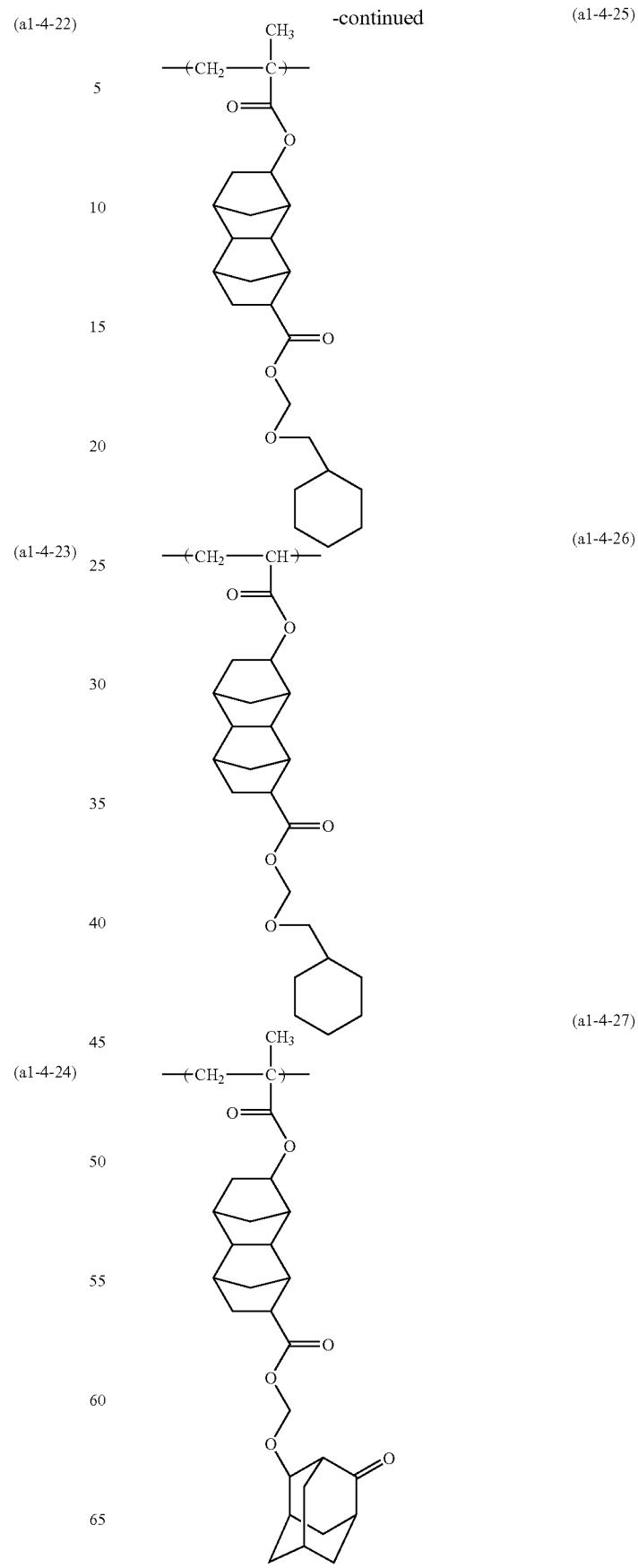

-continued (a1-4-28)

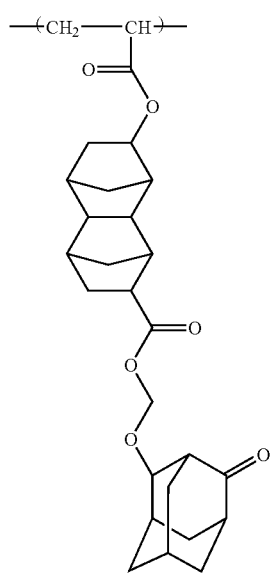

As the structural unit (a1), either a single type of structural unit may be used alone, or a combination of two or more different structural units may be used. Of the various possibilities, structural units represented by the general formula (a1-1) are preferred, and more specifically, the use of at least one structural unit selected from amongst the structural units represented by the chemical formulas (a1-1-1) through (a1-1-40) is even more preferred, and the use of at least one structural unit selected from amongst the structural units of the chemical formulas (a1-1-1) through (a1-1-8) and (a1-1-35) through (a1-1-40) is the most desirable.

The proportion of the structural unit (a1) within the component (A), relative to the combined total of all the structural units that constitute the component (A), is preferably within a range from 10 to 80 mol %, even more preferably from 15 to 70 mol %, and is most preferably from 20 to 50 mol %. Ensuring that this proportion is at least as large as the lower limit of the above range enables a more favorable pattern to be obtained when the component (A) is used in a resist composition, whereas ensuring that the proportion is no greater than the upper limit enables a more favorable balance to be achieved with the other structural units.

Structural Unit (a2)

The structural unit (a2) is a structural unit derived from an (α-lower alkyl)acrylate ester that contains a lactone-containing monocyclic or polycyclic group.

Including the structural unit (a2) is effective in improving the adhesion between the resist film and the substrate, and in enhancing the hydrophilicity relative to the developing solution.

Here, the term "lactone" refers to a single ring containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

There are no particular restrictions on the structural unit (a2), and any unit that includes both this type of lactone structure (—O—C(O)—) and a cyclic group can be used.

Specific examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane or tetracycloalkane. Groups in which one hydrogen atom has been removed from a lactone-containing tricycloalkane with the type of structural formula shown below are preferred for reasons such as industrial availability.

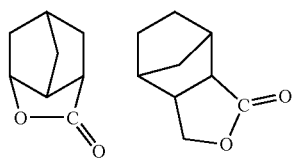

More specific examples of the structural unit (a2) include the structural units represented by general formulas (a2-1) to (a2-5) shown below.

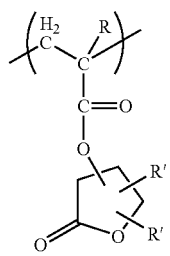

(a2-1)

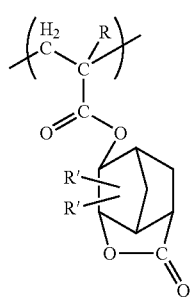

(a2-2)

(a2-3)

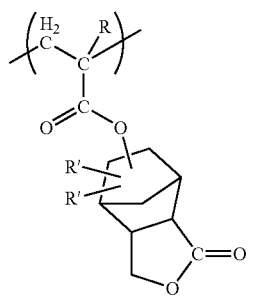

(a2-4)

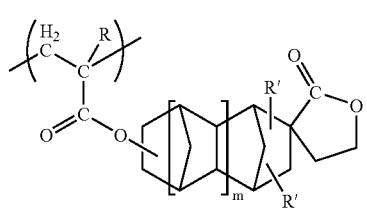

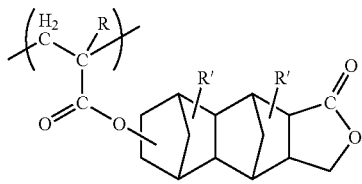

(a2-5)

(wherein, R represents a hydrogen atom or a lower alkyl group, R' represents a hydrogen atom, lower alkyl group, or alkoxy group of 1 to 5 carbon atoms, and m represents an integer of either 0 or 1)

For the lower alkyl groups of R and R' in the general formulas (a2-1) to (a2-5), the same description applies as that used for the lower alkyl group of R in the above structural unit (a1).

In the general formulas (a2-1) to (a2-5), from the viewpoints of factors such as industrial availability, R' is preferably a hydrogen atom. Of the various structural units, those represented by the general formula (a2-1) are preferred.

As the structural unit (a2), either a single type of structural unit may be used alone, or a combination of two or more different structural units may be used.

The proportion of the structural unit (a2) within the component (A), relative to the combined total of all the structural units that constitute the component (A), is preferably within a range from 5 to 60 mol %, even more preferably from 10 to 50 mol %, and is most preferably from 25 to 45 mol %. Ensuring that this proportion is at least as large as the lower limit of the above range enables the effects obtained by including the structural unit (a2) to be satisfactorily realized, whereas ensuring that the proportion is no greater than the upper limit enables a more favorable balance to be achieved with the other structural units.

Structural Unit (a3)

The structural unit (a3) is a structural unit derived from an (α-lower alkyl)acrylate ester that contains a polar group-containing aliphatic hydrocarbon group. Including the structural unit (a3) enhances the hydrophilicity of the resin component (A), thereby improving the affinity with the developing solution during resist pattern formation, improving the alkali solubility within the exposed portions of the resist, and contributing to an improvement in the resolution. Examples of the polar group include a hydroxyl group or cyano group or the like, although a hydroxyl group is particularly preferred.

Examples of the aliphatic hydrocarbon group include straight-chain or branched hydrocarbon groups (alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units that contain a hydroxyl group, cyano group or carboxyl group-containing aliphatic polycyclic group, and are also derived from an (α-lower alkyl)acrylate ester are particularly preferred. Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane. These types of polycyclic groups can be selected appropriately from the multitude of groups proposed for the polymer (resin component) of resist compositions designed for use with ArF excimer lasers. Of these polycyclic groups, an adamantyl group, norbornyl group, or tetracyclododecanyl group is preferred industrially.

When the hydrocarbon group within the polar group-containing aliphatic hydrocarbon group is a straight-chain or branched hydrocarbon group of 1 to 10 carbon atoms, the structural unit (a3) is preferably a structural unit derived from the hydroxyethyl ester of the (α-lower alkyl)acrylic acid, whereas when the hydrocarbon group is a polycyclic group, structural units represented by formulas (a3-1), (a3-2) and (a3-3) shown below are preferred.

(a3-1)

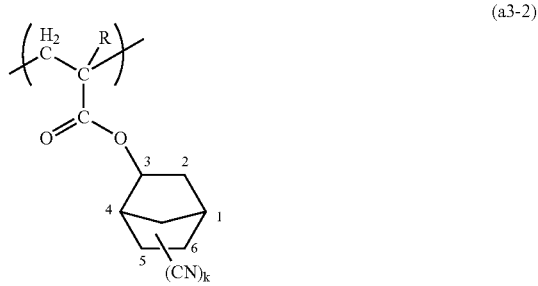

(a3-2)

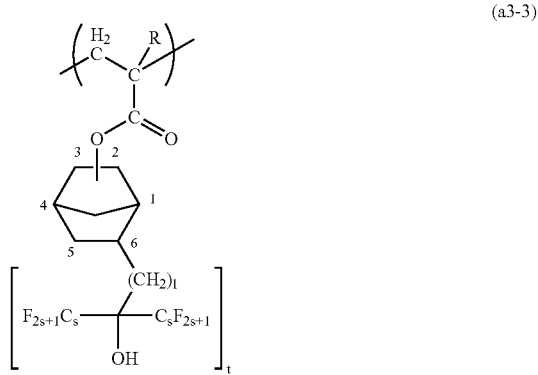

(a3-3)

(wherein, R is as defined above, j represents an integer from 1 to 3, k represents an integer from 1 to 3, l represents an integer from 1 to 3, and t represents an integer from 1 to 3)

In the formula (a3-1), the value of j is preferably 1, and structural units in which the hydroxyl group is bonded to position 3 of the adamantyl group are particularly preferred.

In the formula (a3-2), the value of k is preferably 1. These structural units exist as a mixture of isomers (that is, a mixture of compounds in which the cyano group is bonded to either position 5 or position 6 of the norbornyl group).

In the formula (a3-3), the value of l is preferably 1, and the value of t is preferably 1. These structural units exist as a mixture of isomers (that is, a mixture of compounds in which the bonding position to the acrylate ester is either position 2 or position 3 of the norbornyl group).

As the structural unit (a3), either a single type of structural unit may be used alone, or a combination of two or more different structural units may be used.

From the viewpoint of maximizing the effect of the present invention, the proportion of the structural unit (a3) within the polymer component (A), relative to the combined total of all the structural units that constitute the component (A), is preferably within a range from 5 to 50 mol %, even more preferably from 10 to 35 mol %, and is most preferably from 15 to 30 mol %.

Structural Unit (a4)

In a resist composition of the present invention, the resin component (A) may also include other structural units (a4) besides the structural units (a1) to (a3), provided the inclusion of these other units does not impair the effects of the present invention.

As the structural unit (a4), any other structural unit that cannot be classified as one of the above structural units (a1) through (a3) can be used without any particular restrictions, and any of the multitude of conventional structural units used within resist resins for ArF excimer lasers or KrF excimer lasers (and particularly for ArF excimer lasers) can be used.

As the structural unit (a4), a structural unit that contains a non-acid-dissociable aliphatic polycyclic group, and is also derived from an (α-lower alkyl)acrylate ester is preferred. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In particular, at least one group selected from amongst a tricyclodecanyl group, adamantyl group, tetracyclododecanyl group, isobornyl group, and norbornyl group is preferred in terms of factors such as industrial availability. These polycyclic groups may also be substituted with a straight-chain or branched alkyl group of 1 to 4 carbon atoms.

Specific examples of the structural unit (a4) include units with structures represented by the general formulas (a4-1) to (a4-5) shown below.

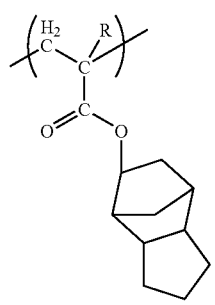

(a4-1)

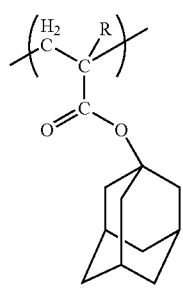

(a4-2)

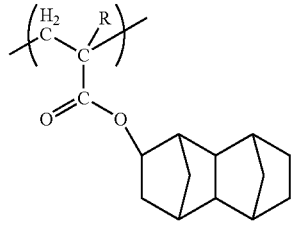

(a4-3)

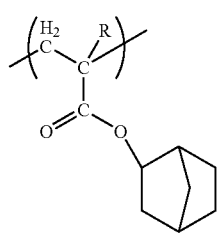

(a4-4)

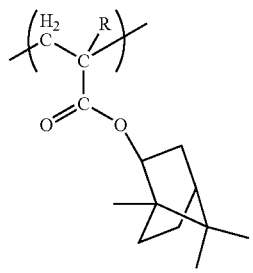

(a4-5)

(wherein, R is as defined above)

Although the structural unit (a4) is not an essential component, if included within the component (A), the proportion of the structural unit (a4), relative to the combined total of all the structural units that constitute the component (A), is typically within a range from 1 to 30 mol %, preferably from 5 to 20 mol %, and is most preferably from 5 to 15% mol %.

The component (A) can be obtained, for example, by a conventional radical polymerization or the like of the monomers that give rise to each of the structural units, using a radical polymerization initiator such as azobisisobutyronitrile (AIBN).

Furthermore, by also using a chain transfer agent such as HS—$CH_2$—$CH_2$—$CH_2$—$C(CF_3)_2$—OH, copolymers in which —$C(CF_3)_2$—OH groups have been introduced at the copolymer terminals can be used.

Although there are no particular restrictions on the weight average molecular weight (Mw) (the polystyrene equivalent value determined by gel permeation chromatography) of the component (A), values within a range from 2,000 to 30,000, preferably from 2,000 to 20,000, and even more preferably from 5,000 to 15,000 are the most desirable in terms of the effects of the present invention. Furthermore, the polydispersity (Mw/Mn) is preferably within a range from 1.0 to 5.0, and even more preferably from 1.0 to 3.0.

The component (A) may use either a single material, or a combination of two or more different materials.

Component (B)

In a resist composition of the present invention, the addition of an oxime sulfonate-based acid generator (B) is essential. In the present invention, a resist composition containing an oxime sulfonate-based acid generator improves the stability over time of the resist pattern, and enables a reduction in the level of developing defects.

In the present invention, the term "oxime sulfonate-based acid generator" describes a compound that contains at least one structure represented by a general formula (B-1) shown below:

(wherein, $R^{21}$ represents an organic group, and $R^{22}$ represents a monovalent organic group or a cyano group), wherein the compound generates acid upon irradiation. These types of oxime sulfonate-based acid generators are widely used within chemically amplified resist compositions, and any of these compounds may be selected and used.

The organic group of $R^{21}$ is preferably an alkyl group or an aryl group. These alkyl groups and aryl groups may also contain substituent groups.

These alkyl groups and aryl groups preferably contain from 1 to 20 carbon atoms, groups of 1 to 10 carbon atoms are even more preferred, and groups of 1 to 6 carbon atoms are the most desirable. Furthermore, the alkyl groups are preferably partially or completely fluorinated alkyl groups, and the aryl groups are preferably partially or completely fluorinated aryl groups.

Furthermore, $R^{22}$ is a cyano group, or a group of the same type as $R^{21}$.

The expression "partially or completely fluorinated alkyl group" refers to either a partially fluorinated alkyl group or a completely fluorinated alkyl group. Similarly, the expression "partially or completely fluorinated aryl group" refers to either a partially fluorinated aryl group or a completely fluorinated aryl group.

Of the various possibilities, $R^{21}$ is preferably an alkyl group or fluorinated alkyl group of 1 to 4 carbon atoms. Furthermore, $R^{22}$ is preferably a cyano group, or an alkyl group or partially or completely fluorinated alkyl group of 1 to 8 carbon atoms.

Specific examples of suitable oxime sulfonate-based acid generators include α-(p-toluenesulfonyloxyimino)-benzyl cyanide, α-p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Furthermore, further examples include the compounds represented by the chemical formulas shown below.

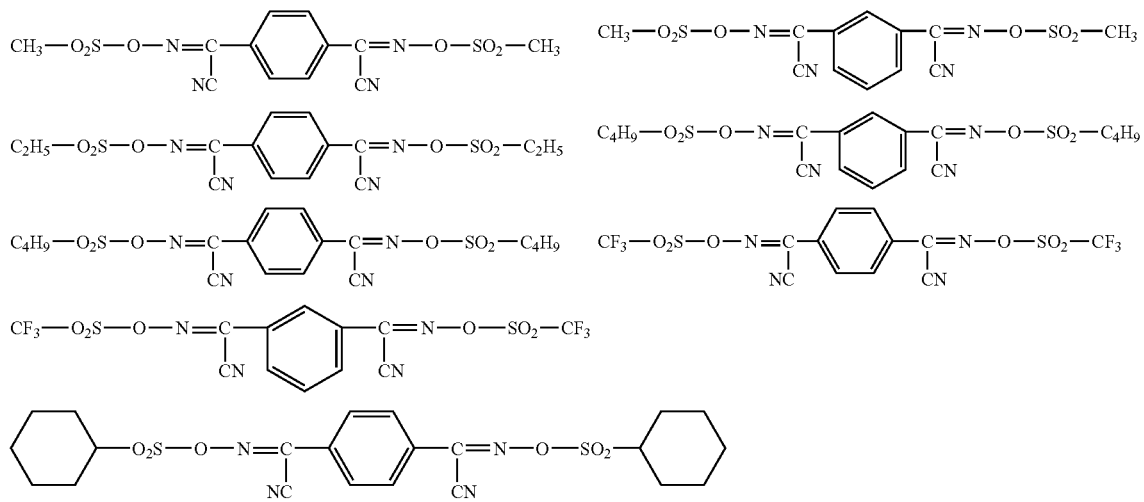

-continued

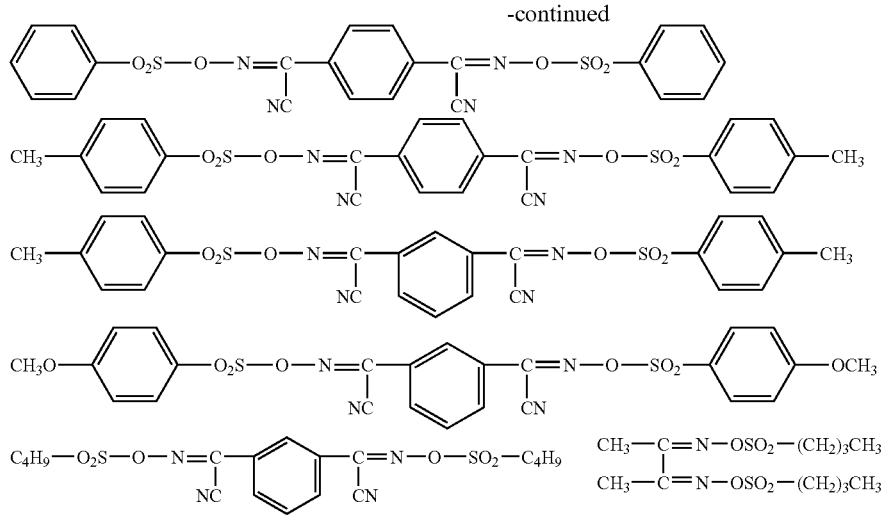

Furthermore, of those compounds that include the aforementioned general formula (B-1), compounds represented by general formulas (B-2) and (B-3) shown below are even more preferred.

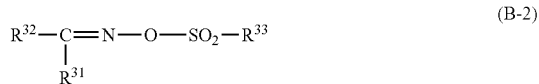
(B-2)

[In this general formula, $R^{31}$ represents a partially or completely halogenated alkyl group or an alkyl halide group. $R^{32}$ represents an aryl group. $R^{33}$ represents a partially or completely halogenated alkyl group or an alkyl halide group.]

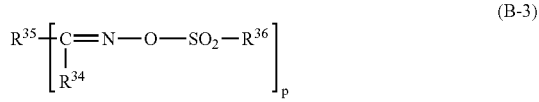
(B-3)

[In this general formula, $R^{34}$ represents a partially or completely halogenated alkyl group or an alkyl halide group. $R^{35}$ represents an aryl group. $R^{36}$ represents a partially or completely halogenated alkyl group or an alkyl halide group. p represents an integer from 2 to 3.]

In the aforementioned general formula (B-2), $R^{31}$ is preferably a partially fluorinated alkyl group of 1 to 10 carbon atoms (and even more preferably 1 to 8 carbon atoms, and most preferably 1 to 6 carbon atoms), or a fluoroalkyl group of 1 to 10 carbon atoms (and even more preferably 1 to 8 carbon atoms, and most preferably 1 to 6 carbon atoms). The above expression "partially fluorinated" refers to alkyl groups in which at least 50%, and preferably 70% or more, and most preferably 90% or more, of the hydrogen atoms within the alkyl group are fluorinated. Of the various possibilities, partially fluorinated alkyl groups are preferred.

$R^{32}$ is preferably a phenyl group, biphenylyl group, fluorenyl group, naphthyl group, anthracyl group, phenanthryl group or heteroaryl group, and may be substituted with an alkyl group, alkyl halide group or alkoxy group of 1 to 10 carbon atoms. Of these groups, a fluorenyl group is preferred. The optional alkyl group or alkyl halide group substituents are preferably groups of 1 to 8 carbon atoms, and even more preferably 1 to 4 carbon atoms. The alkyl halide group is preferably a fluoroalkyl group.

$R^{33}$ is preferably a partially or completely fluorinated alkyl group of 1 to 10 carbon atoms (and even more preferably 1 to 8 carbon atoms, and most preferably 1 to 6 carbon atoms), or a fluoroalkyl group of 1 to 10 carbon atoms (and even more preferably 2 to 8 carbon atoms, and most preferably 3 to 6 carbon atoms). The above expression "partially fluorinated" refers to alkyl groups in which at least 50% of the hydrogen atoms within the alkyl group are fluorinated, and of these, groups in which 70% or more, and even more preferably 90% or more, of the hydrogen atoms are fluorinated are particularly desirable as they increase the strength of the acid that is generated. Fluoroalkyl groups in which 100% of the hydrogen atom have been substituted with fluorine atoms are the most desirable.

In the aforementioned general formula (B-3), $R^{34}$ is preferably a partially fluorinated alkyl group of 1 to 10 carbon atoms (and even more preferably 1 to 8 carbon atoms, and most preferably 1 to 6 carbon atoms), or a fluoroalkyl group of 1 to 10 carbon atoms (and even more preferably 1 to 8 carbon atoms, and most preferably 1 to 6 carbon atoms). The above expression "partially fluorinated" refers to alkyl groups in which at least 50%, and preferably 70% or more, and most preferably 90% or more, of the hydrogen atoms within the alkyl group are fluorinated. Of the various possibilities, partially fluorinated alkyl groups are preferred.

$R^{35}$ is preferably a phenyl group, biphenylyl group, fluorenyl group, naphthyl group, anthracyl group, phenanthryl group or heteroaryl group, and may be substituted with an alkyl group, alkyl halide group or alkoxy group of 1 to 10 carbon atoms. Of these groups, a fluorenyl group is preferred. The optional alkyl group or alkyl halide group substituents are preferably groups of 1 to 8 carbon atoms, and even more preferably 1 to 4 carbon atoms. The alkyl halide group is preferably a fluoroalkyl group.

$R^{36}$ is preferably a partially or completely fluorinated alkyl group of 1 to 10 carbon atoms (and even more preferably 1 to 8 carbon atoms, and most preferably 1 to 6 carbon atoms), or a fluoroalkyl group of 1 to 10 carbon atoms (and even more preferably 2 to 8 carbon atoms, and most preferably 3 to 6 carbon atoms). The above expression "partially fluorinated" refers to alkyl groups in which at least 50% of the hydrogen atoms within the alkyl group are fluorinated, and of these, groups in which 70% or more, and even more preferably 90% or more, of the hydrogen atoms are fluorinated are particularly desirable as they increase the strength of the acid that is generated. Fluoroalkyl groups in which 100% of the hydrogen atom have been substituted with fluorine atoms are the most desirable.

The value of p is preferably 2.

Of the compounds represented by the above general formulas (B-2) and (B-3), examples of preferred compounds include those shown below.

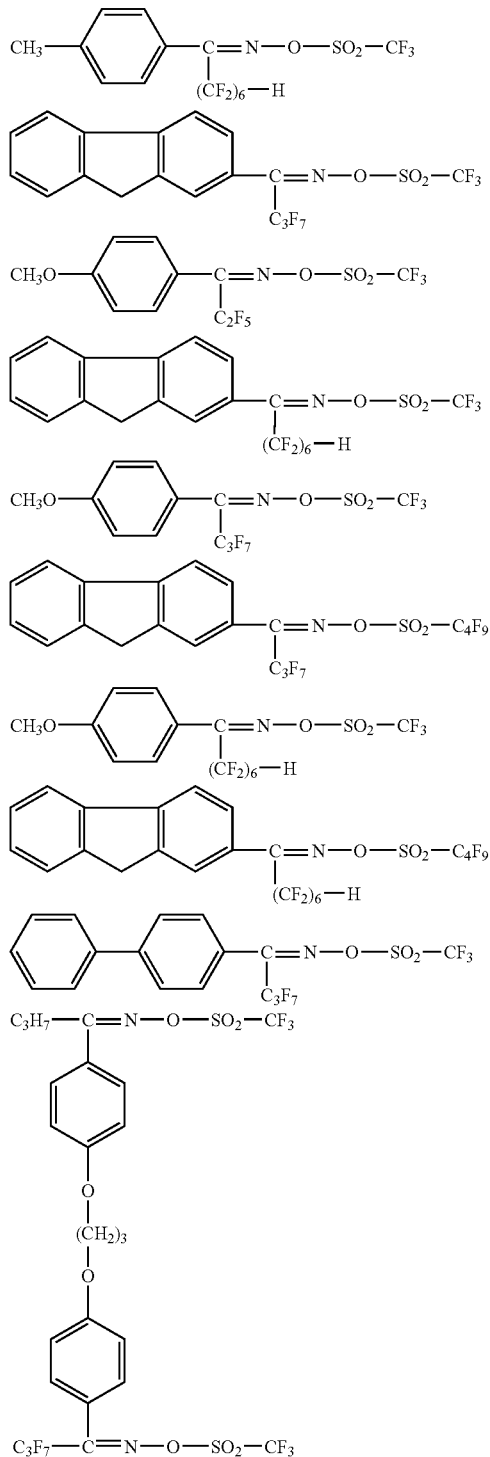

-continued

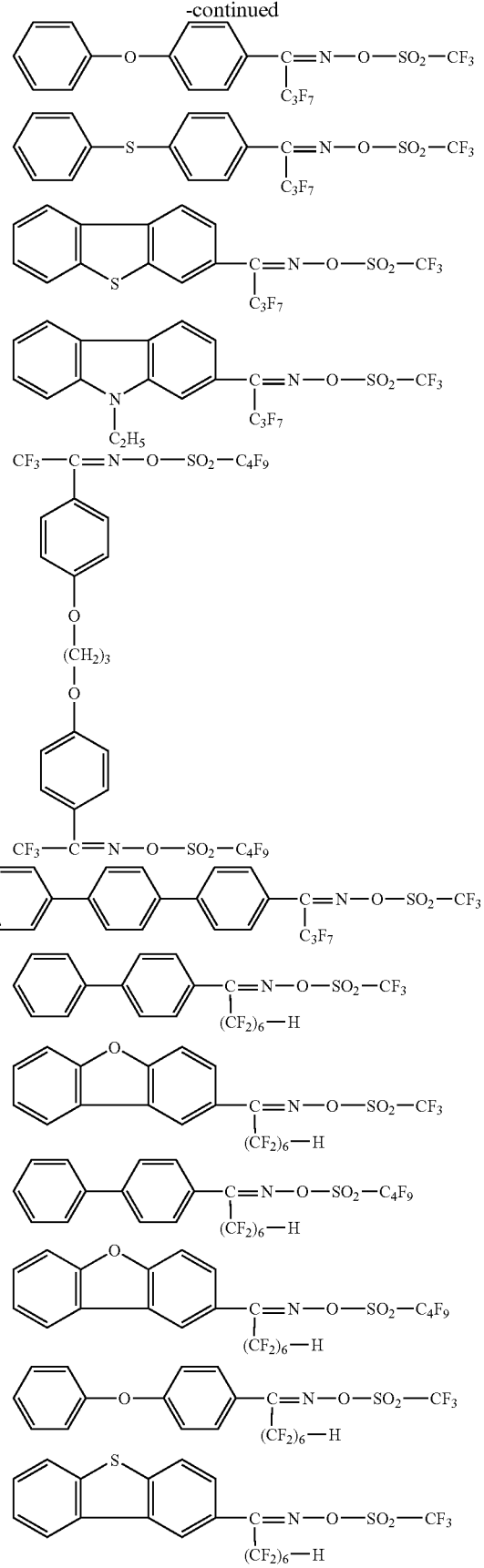

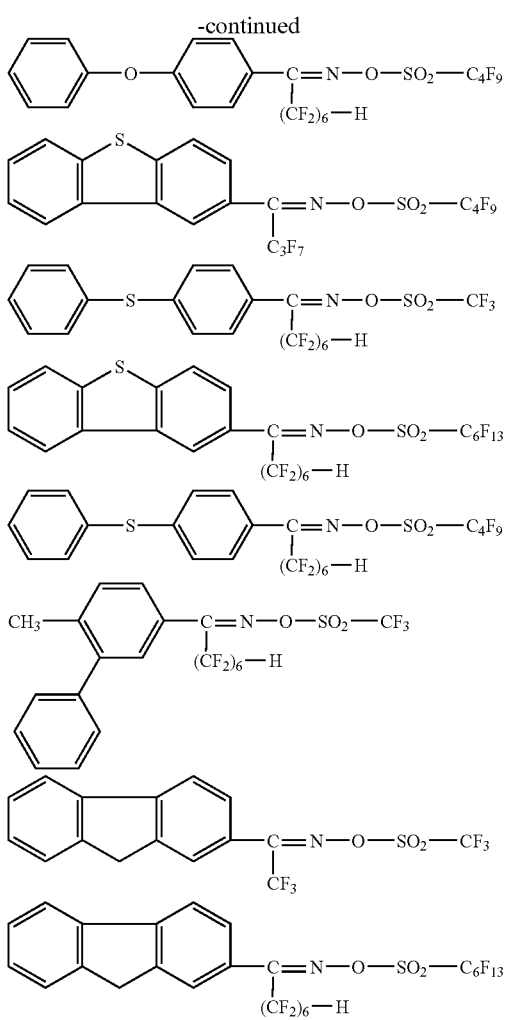

Of the sample compounds listed above, the compound represented by the chemical formula (24) below is preferred.

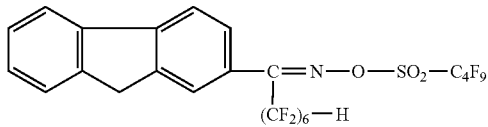

(24)

The blend quantity of the component (B) is typically within a range from 0.01 to 20 parts by weight, preferably from 0.1 to 10 parts by weight, and even more preferably from 1 to 8 parts by weight, per 100 parts by weight of the component (A). Ensuring this blend quantity is at least 0.01 parts by weight enables favorable pattern formation, whereas ensuring the quantity is no more than 20 parts by weight is preferred in terms of reducing the level of developing defects.

The component (B) may use either a single compound, or two or more different compounds.

In a resist composition of the present invention, other acid generators besides the component (B) may also be used in combination with the component (B) if required, provided their use does not impair the effects of the present invention, and examples of these other acid generators include onium salt-based acid generators such as iodonium salts and sulfonium salts, diazomethane-based acid generators such as bisalkyl or bisaryl sulfonyl diazomethanes and poly(bis-sulfonyl)diazomethanes, nitrobenzyl sulfonate-based acid generators, and iminosulfonate-based acid generators.

Component (C)

In the present invention, the component (C) must include methyl n-amyl ketone (alternative name: 2-heptanone). Inclusion of this compound enables the stability over time of the resist pattern to be improved, and also enables a reduction in the level of developing defects.

The quantity of methyl n-amyl ketone within the component (C) is typically within a range from 10 to 60% by weight, preferably from 20 to 50% by weight, and even more preferably from 30 to 45% by weight. By ensuring this quantity is at least 10% by weight, precipitation of the oxime sulfonate-based acid generator during coating can be inhibited. Ensuring the quantity is no greater than 60% by weight enables the methyl n-amyl ketone to be combined with a solvent described below, which exhibits a higher relative polarity than the methyl n-amyl ketone, thereby enabling a reduction in the level of developing defects.

The term "defects" refers to scum and general resist pattern abnormalities detected, for example, by inspection of the developed resist pattern from directly above the resist pattern using a surface defect inspection device (brand name: KLA) manufactured by KLA Tencor Corporation.

In other words, the component (C) preferably also includes at least one solvent selected from amongst propylene glycol monomethyl ether acetate (PGMEA), propylene glycol monomethyl ether (PGME), and ethyl lactate (EL). These solvents have a relatively high polarity when compared with methyl n-amyl ketone. As described above, the action of these solvents enables a reduction in the level of post-developing defects. In particular, combinations of these solvents with a component (A) that includes structural units of comparatively high polarity such as the (a2) units and (a3) units yield particularly large effects.

Of the above solvents, propylene glycol monomethyl ether acetate (PGMEA) is preferred.

The blend quantity of these relative high polarity solvents within the component (C) is typically within a range from 40 to 90% by weight, preferably from 50 to 80% by weight, and even more preferably from 55 to 70% by weight. Ensuring this quantity is at least as large as the lower limit of the above range enables a reduction in post-developing defects to be achieved, whereas ensuring the quantity is no greater than the upper limit enables a favorable balance to be achieved with the methyl n-amyl ketone, which enables precipitation of the oxime sulfonate-based acid generator during coating to be reduced. Furthermore, the stability over time of the resist pattern can also be improved.

The component (C) may also include one or more other conventional organic solvents typically used as resist composition solvents, provided such inclusion does not impair the effects of the present invention. There are no particular restrictions on the quantity used of the component (C), which is set in accordance with the desired film thickness so as to produce a concentration that enables favorable application to a support such as a substrate or the like, and is typically sufficient to produce a solid fraction concentration within the resist composition of 2 to 20% by weight, and preferably from 5 to 15% by weight.

Nitrogen-containing Organic Compound (D)

In a resist composition of the present invention, in order to achieve the object of the present invention, an amine compound (D) containing at least one alkyl group of 5 to 12 carbon atoms (hereafter referred to as the component (D)) must be added to the composition.

A multitude of these components (D) have already been proposed, and any of these known compounds may be used, although an amine, and particularly a secondary lower aliphatic amine or a tertiary lower aliphatic amine is preferred.

Specific examples of the component (D) include alkylamines such as tri-n-pentylamine, tri-n-heptylamine, tri-n-octylamine, tri-n-nonylamine, tri-n-decylamine, tri-n-dodecylamine, tri-n-decanylamine, di-n-pentylamine, di-n-heptylamine, di-n-octylamine, di-n-nonylamine, di-n-decylamine, and di-n-dodecylamine.

In the present invention, trialkylamines containing at least one alkyl group of 5 to 12 carbon atoms, such as tri-n-octylamine and tri-n-dodecylamine are preferred.

These compounds can be used either alone, or in combinations of two or more different compounds.

The component (D) is typically used in a quantity within a range from 0.01 to 5.0 parts by weight, preferably from 0.1 to 3 parts by weight, and even more preferably from 0.2 to 1.0 parts by weight, per 100 parts by weight of the component (A).

Component (E)

In a resist composition of the present invention, in order to achieve the object of the present invention, a dibasic acid must be added as an organic acid, for the purposes of preventing any sensitivity deterioration caused by the addition of the aforementioned component (D), as well as reducing the level of defects, and improving factors such as the resist pattern shape and the stability over time of the resist pattern. This dibasic acid preferably has a first step pKa (acid dissociation constant) of no more than 4, as such acids yield superior effects for the present invention.

Specific examples of the dibasic acid include malonic acid, maleic acid, succinic acid, and salicylic acid.

The component (E) is preferably used in a ratio within a range from 0.01 to 5.0 mols, and even more preferably from 0.1 to 3.0 mols, and most preferably from 0.5 to 2.5 mols, per 1 mol of the component (D). By using a quantity within this range, the stability over time of the resist pattern can be improved, and the level of developing defects can also be reduced.

The reason that combining the above components (A) through (E) enables an improvement in the stability over time of the resist pattern, and a reduction in the level of developing defects remains unclear, although it is thought to represent a synergistic effect resulting from the combination of all of these components.

Other miscible additives can also be added to a positive resist composition of the present invention according to need, and examples include additive resins for improving the performance of the resist film, surfactants for improving the ease of application, dissolution inhibitors, plasticizers, stabilizers, colorants, halation prevention agents, and dyes.

[Method for Forming a Resist Pattern]

A method for forming a resist pattern according to the present invention can be conducted, for example, in the manner described below. The following description describes the case for a positive resist composition.

Namely, a positive resist composition is first applied to a substrate such as a silicon wafer using a spin coater or the like, and a prebake is then conducted under temperature conditions of 80 to 150° C., for a period of 40 to 120 seconds, and preferably for 60 to 90 seconds, thus forming a resist film. This resist film is selectively exposed with an ArF exposure apparatus or the like, by irradiating ArF excimer laser light through a desired mask pattern, and PEB (post exposure baking) is then conducted under temperature conditions of 80 to 150° C., for a period of 40 to 120 seconds, and preferably for 60 to 90 seconds. Subsequently, a developing treatment is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

There are no particular restrictions on the wavelength used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. The present invention is particularly effective for use with an ArF excimer laser.

Furthermore, a resist composition of the present invention can be applied favorably to a substrate that includes a nitrogen-containing layer. In other words, a resist composition of the present invention is ideal for use with a substrate that includes a nitrogen-containing layer. The reason for this observation is that when a substrate that includes a nitrogen-containing layer is used, the resist pattern that contacts the nitrogen-containing layer is particularly prone to a tailing phenomenon, but by application of the present invention, this tailing phenomenon can be reduced considerably.

A nitrogen-containing layer typically refers to a layer such as an insulating layer or metal layer or the like, which contains nitrogen, and is provided on top of the substrate in accordance with the intended use of the substrate. Examples of this type of insulating layer include silicon nitride (SiN) and trisilicon tetranitride ($Si_3N_4$). Examples of the above type of metal layer include titanium nitride (TiN).

The nitrogen-containing layer is typically formed on top of a silicon substrate or the like, using a method such as vapor deposition.

Substrates that include this type of nitrogen-containing layer are typically referred to as "nitrogen-containing substrates".

Furthermore, a resist composition of the present invention can also be applied favorably to a substrate that is provided with an anti-reflective film [an organic anti-reflective film (an anti-reflective film formed from an organic compound) or an inorganic anti-reflective film (an anti-reflective film formed from an inorganic compound)]. The present invention is particularly suited to organic anti-reflective films.

The reason for this suitability is that when a substrate with an anti-reflective film (an organic anti-reflective film or an inorganic anti-reflective film) provided thereon is used, the resist pattern that contacts the anti-reflective film is particularly prone to a tailing phenomenon, but by application of the present invention, this tailing phenomenon can be reduced considerably.

Examples of organic anti-reflective films include AR46 (a product name: manufactured by Shipley Co., Ltd.), and although using AR46 significantly increases the chance of the tailing phenomenon occurring, by applying the present invention, this tailing can be inhibited.

[Method for Forming Resist Pattern that Includes a Thermal Flow Process]

A thermal flow process is conducted after the formation of a resist pattern in the manner described above.

The thermal flow process is conducted, for example, in the manner described below. Namely, by heating the developed resist pattern at least once, and preferably 2 to 3 times, thereby softening the resist and causing it to flow, the size of the resist pattern (for example, the hole diameter in the case of a hole pattern or the space width in the case of a line and space pattern) is shrunk (narrowed) to a size smaller than that immediately following developing.

The ideal heating temperature varies depending on the make-up of the resist composition, and although there are no particular restrictions provided the temperature is at least as high as the softening point of the resist pattern, the heating temperature is preferably within a range from 80 to 180° C., and even more preferably from 110 to 150° C. Ensuring the heating temperature falls within this range offers various advantages, including facilitating better control of the pattern size.

Furthermore, there are no particular restrictions on the ideal heating time, provided it does not impede the throughput, and enables the desired pattern size to be obtained, although considering a typical semiconductor element production line process, the time period of a single heating process is preferably within a range from 10 to 300 seconds, and even more preferably from 30 to 180 seconds.

Even when a thermal flow process is conducted, a resist composition of the present invention is able to suppress the precipitation of the component (B), and even when heating is conducted during the thermal flow process, deterioration of the resist composition such as gasification can be favorably suppressed.

Namely, in the case of a typical ArF excimer laser resist composition that uses an onium salt-based acid generator, the heating during the thermal flow process tends to cause foaming within the pattern. It is thought that the reason for this problem is that when, for example, a half tone reticle or the like is used, a certain degree of light is irradiated onto even the unexposed portions, and when these portions are heated during the thermal flow process, dissociation of the acid-dissociable, dissolution-inhibiting groups causes the generation of the foam described above.

In contrast, although the reasons are not entirely clear, it appears that because the present invention uses an oxime sulfonate-based acid generator, surprisingly, the foaming problem described above can be significantly reduced. Accordingly, a resist composition of the present invention is also ideal for use within thermal flow processes.

EXAMPLES

Resist Compositions of Examples 1 to 4 and Comparative Examples 1 to 6

Positive resist compositions were prepared with the compositions described below.

Component (A)

100 parts by weight of a copolymer formed from the structural units represented by chemical formulas (30) shown below (Mw: 10,000, polydispersity: 2.1, q:r:s=40:40:20 (mol %)).

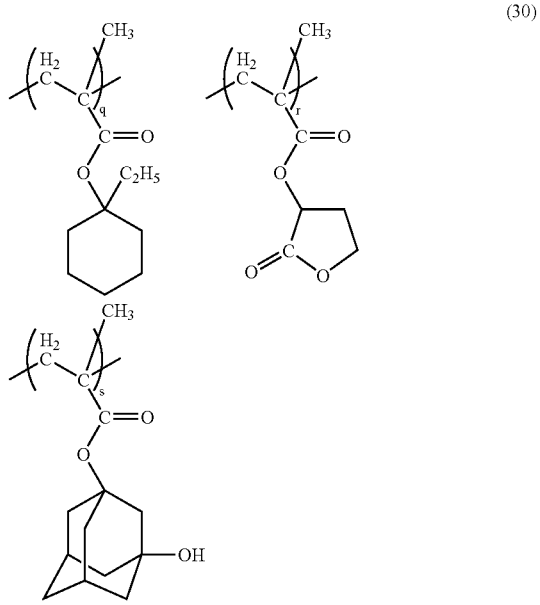

(30)

Component (B)

5.0 parts by weight of the compound represented by the aforementioned chemical formula (24).

Component (C)

A mixed solvent prepared by mixing methyl n-amyl ketone and PGMEA in a weight ratio of 4:6 was used, and the quantity of this solvent was adjusted to yield a solid fraction concentration within the resist composition of 10% by weight.

The nature and respective quantities of the component (D) and the component (E) are shown in Table 1. The quantities shown for the component (E) represent a number of mols per 1 mol of the component (D).

Evaluations were conducted using the resist compositions described above.

TABLE 1

| | Nitrogen-containing organic compound (D) (parts by weight) | Organic acid (E) (mol) | Storage method | 2 weeks | | |
|---|---|---|---|---|---|---|
| | | | | Hole diameter (nm) | Dimensional difference (nm) | Developing defects (number) |
| Example 1 | Amine 1 (0.7) | Maleic acid (1.5) | freezer 40° C. | 129.7 134.4 | 4.70 | 53 |
| Example 2 | Amine 1 (0.7) | Salicylic acid (1.5) | freezer 40° C. | 135.1 140.5 | 5.40 | 49 |
| Example 3 | Amine 1 (0.7) | Salicylic acid (2.0) | freezer 40° C. | 128.3 131.6 | 3.30 | 50 |
| Example 4 | Amine 1 (0.7) | Salicylic acid (1.0) | freezer 40° C. | 128.1 135 | 6.90 | 39 |
| Comparative example 1 | Amine 2 (0.25) | — | freezer 40° C. | 139.98 204.35 | 64.57 | 35 |

TABLE 1-continued

|  | Nitrogen-containing organic compound (D) (parts by weight) | Organic acid (E) (mol) | Storage method | Hole diameter (nm) 2 weeks | Dimensional difference (nm) | Developing defects (number) |
|---|---|---|---|---|---|---|
| Comparative example 2 | Amine 2 (0.25) | Malonic acid (1.5) | freezer 40° C. | 135.6 138.2 | 2.60 | 5213 |
| Comparative example 3 | Amine 2 (0.25) | Malonic acid (1.0) | freezer 40° C. | 137.78 143.32 | 5.53 | 3185 |
| Comparative example 4 | Amine 2 (0.25) | Malonic acid (0.5) | freezer 40° C. | 139.98 165.93 | 25.96 | 1230 |
| Comparative example 5 | Amine 2 (0.25) | Maleic acid (1.5) | freezer 40° C. | 135.9 138.24 | 2.34 | 503 |
| Comparative example 6 | Amine 2 (0.25) | Acetic acid (1.5) | freezer 40° C. | 140.31 197.84 | 57.53 | 51 |

Salicylic acid: pKa = 2.81
Maleic acid: pKa = 1.75
Malonic acid: pKa = 2.65
Acetic acid: pKa = 4.56
Amine 1: tri-n-decylamine
Amine 2: triethanolamine <Storage Method>

Samples of the resist compositions prepared in the examples 1 to 4 and the comparative examples 1 to 6 were stored for two weeks either in a freezer (−20° C.) or at 40° C.

<Dimensional Difference>

For each of the resist compositions from the examples 1 to 4 and the comparative examples 1 to 6, the resist composition (R1) that had been stored for two weeks in a freezer, and the resist composition (R2) that had been stored for two weeks at 40° C. were compared by first applying an organic anti-reflective film material (product name: AR46, manufactured by Shipley Co., Ltd.) to the surface of an 8-inch silicon wafer, and then conducting baking at 225° C. for 60 seconds, thereby forming an anti-reflective film with a film thickness of 29 nm and completing preparation of a substrate.

Each of the above positive resist compositions was then applied uniformly to the surface of an aforementioned substrate using a spinner, and was then prebaked and dried on a hotplate at 120° C. for 60 seconds, thereby forming a resist layer with a film thickness of 240 nm. Subsequently, the thus obtained resist layer was selectively exposed through a mask, using an ArF exposure apparatus (wavelength: 193 nm) NSR-S306C (manufactured by Nikon Corporation, NA (numerical aperture)=0.78, σ=0.60).

A PEB treatment was then conducted at 120° C. for 60 seconds, the resist film was subjected to puddle development for 60 seconds at 23° C. in a 2.38% by weight aqueous solution of tetramethylammonium hydroxide, and was then rinsed for 30 seconds with pure water and shaken dry, completing formation of a contact hole (1:1) resist pattern (hereafter referred to as a C/H pattern). The formula shown below was then used to calculate the dimensional difference for the resist pattern. Smaller absolute values for the resist pattern dimensional difference indicate a resist composition with superior stability over time of the resist pattern.

Dimensional difference (nm)=|$R1$ hole diameter−$R2$ hole diameter|

<Developing Defects>

For resist compositions of the examples 1 to 4 and the comparative examples 1 to 6 that had been stored for one week in a freezer, an organic anti-reflective film material (product name: AR46, manufactured by Shipley Co., Ltd.) was first applied to the surface of an 8-inch silicon wafer, and then baked at 225° C. for 60 seconds, thereby forming an anti-reflective film with a film thickness of 29 nm and completing preparation of a substrate.

Each of the above positive resist compositions was then applied uniformly to the surface of an aforementioned substrate using a spinner, and was then prebaked and dried on a hotplate at 120° C. for 60 seconds, thereby forming a resist layer with a film thickness of 240 nm. Subsequently, the thus obtained resist layer was selectively exposed through a mask, using an ArF exposure apparatus (wavelength: 193 nm) NSR-S306C (manufactured by Nikon Corporation, NA (numerical aperture)=0.78, σ=0.60).

A PEB treatment was then conducted at 120° C. for 60 seconds, the resist film was subjected to puddle development for 60 seconds at 23° C. in a 2.38% by weight aqueous solution of tetramethylammonium hydroxide, and was then rinsed for 30 seconds with pure water and shaken dry, completing formation of a 130 nm line and space (1:1) resist pattern (hereafter referred to as a L/S pattern). The resist pattern was then evaluated using a surface defect inspection apparatus KLA2132, manufactured by KLA Tencor Corporation, and the number of defects on the wafer was measured. Three wafers were tested, and the average value of the three results was calculated.

The dimensional difference for each of the resist compositions of the examples 1 to 4 was less than 7 nm, and the number of developing defects was an extremely small value of no more than 60. The comparative examples 1 and 6 were able to reduce the level of developing defects, but the dimensional difference values were 64.57 nm and 57.53 nm respectively, which represent extremely large values. The comparative examples 2, 3, and 5 exhibited small dimensional difference values, but were unable to reduce the level of developing defects. The comparative example 4 was unable to reduce either the dimensional difference or the level of developing defects.

INDUSTRIAL APPLICABILITY

A resist composition containing an oxime sulfonate-based acid generator is able to improve the stability over time of a resist pattern, and also reduce the level of developing defects.

The invention claimed is:

1. A resist composition, comprising a resin component (A) that exhibits changed alkali solubility under action of acid, an oxime sulfonate-based acid generator (B), an amine compound (D) containing at least one alkyl group of 5 to 12 carbon atoms, and an organic acid (E), all dissolved in an organic solvent (C) comprising methyl n-amyl ketone, wherein said component (E) is a dibasic acid.

2. A resist composition according to claim 1, wherein an acid dissociation constant (pKa) of said component (E) is no greater than 4.

3. A resist composition according to claim 1, wherein said component (E) includes at least one compound selected from the group consisting of salicylic acid, maleic acid, succinic acid, and malonic acid.

4. A resist composition according to claim 1, wherein a quantity of methyl n-amyl ketone within said component (C) is within a range from 10 to 60% by weight.

5. A resist composition according to claim 4, wherein said component (C) further includes one or more compounds selected from the group consisting of propylene glycol monomethyl ether acetate (PGMEA), propylene glycol monomethyl ether (PGME), and ethyl lactate (EL).

6. A resist composition according to claim 1, which is for use with a substrate having a nitrogen-containing layer or a substrate with an anti-reflective film provided thereon.

7. A resist composition according to claim 1, which is for use within a thermal flow process.

8. A resist composition according to claim 6, which is for use within a thermal flow process.

9. A method for forming a resist pattern, comprising:
applying a resist composition according to any one of claim 1 through claim 8 to a substrate;
conducting a prebake;
performing selective exposure;
subsequently conducting PEB (post exposure baking); and
performing alkali developing to form a resist pattern.

10. A method for forming a resist pattern, comprising:
a resist pattern formation process, which includes applying a resist composition according to any one of claim 1 through claim 8 to a substrate, conducting a prebake, performing selective exposure, subsequently conducting post exposure baking (PEB), and performing alkali developing to form a resist pattern; and
a narrowing process that narrows a pattern size of an obtained resist pattern by conducting a heat treatment.

11. A resist composition according to claim 1, wherein the oxime sulfonate-based acid generator is a compound that contains at least one structure represented by a general formula (B-1) shown below:

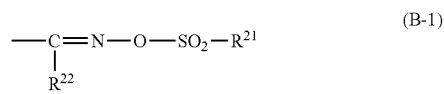

wherein, $R^{21}$ represents an organic group, and $R^{22}$ represents a monovalent organic group or a cyano group.

12. A resist composition according to claim 1, wherein the component (E) is in a ratio within a range of from 0.01 to 5.0 mols per 1 mol of the component (D).

13. A resist composition according to claim 1, wherein the amine compound (D) is tri-n-heptylamine, tri-n-octylamine, tri-n-nonylamine, tri-n-decylamine, tri-n-dodecylamine, tri-n-decanylamine, di-n-pentylamine, di-n-heptylamine, di-n-octylamine, di-n-nonylamine, di-n-decylamine, or di-n-dodecylamine.

14. A resist composition according to claim 1, wherein said component (A) contains at least 80 mol % of a structural unit derived from an (α-lower alkyl) acrylate ester.

* * * * *